United States Patent
Chen et al.

(10) Patent No.: US 12,250,756 B2
(45) Date of Patent: Mar. 11, 2025

(54) CONTROL CIRCUIT AND LIGHTING DEVICE

(71) Applicants: SUZHOU OPPLE LIGHTING CO., LTD., Suzhou (CN); OPPLE LIGHTING CO., LTD., Shanghai (CN)

(72) Inventors: Feng Chen, Suzhou (CN); Pingwei Zhang, Suzhou (CN)

(73) Assignees: SUZHOU OPPLE LIGHTING CO., LTD., Suzhou (CN); OPPLE LIGHTING CO., LTD., Shanghai (CN)

( * ) Notice: Subject to any disclaimer, the term of this patent is extended or adjusted under 35 U.S.C. 154(b) by 125 days.

(21) Appl. No.: 18/143,051

(22) Filed: May 3, 2023

(65) Prior Publication Data

US 2023/0276550 A1 Aug. 31, 2023

Related U.S. Application Data

(63) Continuation of application No. PCT/CN2021/126869, filed on Oct. 28, 2021.

(30) Foreign Application Priority Data

Nov. 4, 2020 (CN) .......................... 202011215920.7

(51) Int. Cl.
*H05B 45/22* (2020.01)
*G11C 27/02* (2006.01)
(Continued)

(52) U.S. Cl.
CPC ............. *H05B 45/22* (2020.01); *G11C 27/02* (2013.01); *H05B 45/345* (2020.01); *H05B 45/3725* (2020.01)

(58) Field of Classification Search
CPC ........ H05B 45/22; H05B 45/24; H05B 45/30; H05B 45/34; H05B 45/345; H05B 45/37;
(Continued)

(56) References Cited

U.S. PATENT DOCUMENTS 9,585,219 B2 * 2/2017 Ahn ....................... H05B 45/44
2024/0128712 A1 * 4/2024 Hu .......................... H01S 5/042

FOREIGN PATENT DOCUMENTS

CN 106455227 A 2/2017
CN 207744200 U 8/2018
(Continued)

OTHER PUBLICATIONS

International Search Report of PCT Application No. PCT/CN2021/126869 dated Dec. 16, 2021with English translation, (5p).

*Primary Examiner* — Long Nguyen
(74) *Attorney, Agent, or Firm* — Arch & Lake LLP; Hao Tan; Shen Wang (57) ABSTRACT

The disclosure disclose a control circuit and a lighting device, relates to a technical field of illumination. In the power-on process of the control circuit, the voltage input to the driving input terminal of the constant current driving module rises slowly, resulting in the current overshoot phenomenon of the light source load. In the control circuit disclosed by the present disclosure, because the output current of the first regulation output terminal is positively correlated with the output voltage of the voltage limiting terminal, and the output current of the second regulation output terminal is negatively correlated with the output voltage of the voltage limiting terminal, during the power-on process of the control circuit, that is, during the voltage at the voltage limiting terminal is changed from zero to the first threshold value, the current input to the driving input terminal can be relatively constant.

19 Claims, 8 Drawing Sheets

(51) Int. Cl.
*H05B 45/345* (2020.01)
*H05B 45/3725* (2020.01)

(58) Field of Classification Search
CPC .......................... H05B 45/3725; H05B 45/395; H05B 45/397; H05B 47/24; H05B 47/25; G11C 27/02; G11C 27/024
See application file for complete search history.

(56) References Cited

FOREIGN PATENT DOCUMENTS

| | | |
|---|---|---|
| CN | 209692345 U | 11/2019 |
| CN | 111465144 A | 7/2020 |
| CN | 111629490 A | 9/2020 |
| CN | 112291886 A | 1/2021 |
| JP | 2017142970 A | 8/2017 |

* cited by examiner

CONTROL CIRCUIT AND LIGHTING DEVICE

CROSS-REFERENCE TO RELATED APPLICATIONS

This application is based upon and claims the priority of PCT patent application No. PCT/CN2021/126869 filed on Oct. 28, 2021 which claims priority to the Chinese patent application No. 202011215920.7 filed on Nov. 4, 2020 and the Chinese patent application No. 202022525704.7 filed on Nov. 4, 2020, the entire contents of which are hereby incorporated by reference herein for all purposes.

TECHNICAL FIELD

This application relates to a technical field of illumination, in particular to a control circuit and a lighting device.

BACKGROUND

In a lighting device, a control circuit can drive a load by using the constant power regulation technology, that is, when the input voltage of the line network is high, the output current is reduced, to keep the input power of the light source load basically unchanged.

SUMMARY

The present disclosure provides a control circuit. The control circuit may include: a signal sampling module, a constant power regulation module, a negative feedback regulation module, and a constant current driving module.

The signal sampling module may include a voltage limiting terminal, the voltage limiting terminal is configured to output limiting voltage value, and the limiting voltage value is lower than a first threshold value.

The constant power regulation module may include a first regulation input terminal and a first regulation output terminal, the voltage limiting terminal is connected to the first regulation input terminal, and an output current of the first regulation output terminal is positively correlated with an input voltage of the first regulation input terminal.

The negative feedback regulation module may include a second regulation input terminal and a second regulation output terminal, the voltage limiting terminal is connected to the second regulation input terminal, and an output current of the second regulation output terminal is negatively correlated with an input voltage of the second regulation input terminal; and the constant current driving module may include a driving input terminal, and the first regulation output terminal and the second regulation output terminal are connected to the driving input terminal.

It is to be understood that the foregoing general description and the following detailed description are exemplary and explanatory only and are not restrictive of the disclosure.

BRIEF DESCRIPTION OF THE DRAWINGS

The drawings described herein are used to provide further understanding of the present disclosure and constitute a part of the present disclosure. The exemplary examples and descriptions of the present disclosure are used to explain the present disclosure and do not constitute an improper limitation of the present disclosure. In the drawings.

DETAILED DESCRIPTION

In order to make the objectives, technical solutions and advantages of the present disclosure clearer, technical solutions of the examples will be described in a clearly and fully understandable way in connection with the drawings related to the examples of the disclosure. It is apparent that the described examples are a part but not all of the examples of the disclosure. Based on the described examples herein, one of ordinary skill in the art can obtain other example(s), without any creative work, which shall be within the scope of the disclosure.

Reference numerals used in this disclosure may include:
  100'—control circuit; 10'—signal sampling module; 20'—constant power regulation module; 30'—constant current driving module; 40'—power supply module; 50'—light source load;
  Vin'—signal sampling input voltage; R1'—first resistor; R2'—second resistor; R3'—third resistor; C1'—first capacitor; M1'—first switching transistor; Rext'—current regulation resistor; VT'—voltage limiting terminal; Vt'—limiting voltage value; Vth'—drain electrode voltage; INV1'—first operational amplifier; W'—current mirror module; IA1'—first regulation output current; Vref1'—first reference voltage; Iout'—load working current;
  100—control circuit; 10—signal sampling module; 20—constant power regulation module; 21—first regulation input terminal; 22—first regulation output terminal; 30—negative feedback regulation module;

31—second regulation input terminal; 32—second regulation output terminal; 40—constant current driving module; 41—driving input terminal; 50—power supply module; 60—light source load;

Vin—signal sampling input voltage; R1—first resistor; R2—second resistor; R3—third resistor; R4—fourth resistor; C1—first capacitor; M1—first switching transistor; M2—second switching transistor; M3—third switching transistor; M1—1—fourth switching transistor; Rext—current regulation resistor; VT—voltage limiting terminal; Vt—limiting voltage value; Vth—drain electrode voltage; INV1—first operational amplifier; INV2—second operational amplifier; INV1—1—third operational amplifier; W1—constant power current mirror; W2—feedback current mirror; IA1—first regulation output current; IA2—second regulation output current; IA3—driving input current; Vref1—first reference voltage; Vref2—second reference voltage; Iout—load working current; Iout1—first load current; Iout2—second load current; U1—chip.

Sometimes, at the moment of power-on of the constant power regulation technology, the current output to the light source load has an overshoot phenomenon, causing the light source load to be easily damaged or broken down.

Referring to FIG. 1, FIG. 2, and FIG. 3a to FIG. 3e, the phenomenon of current overshoot generated on the light source load 50' in the current control circuit 100' is specifically described.

Figure 1:
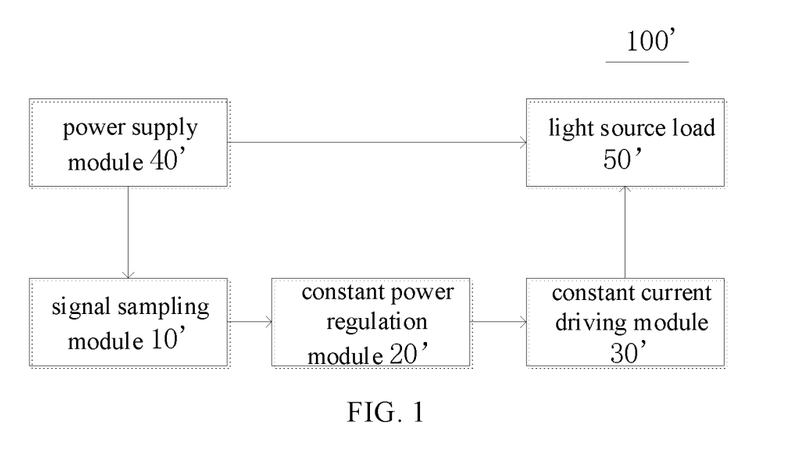
FIG. 1 shows a schematic module diagram of a control circuit.
Figure 2:
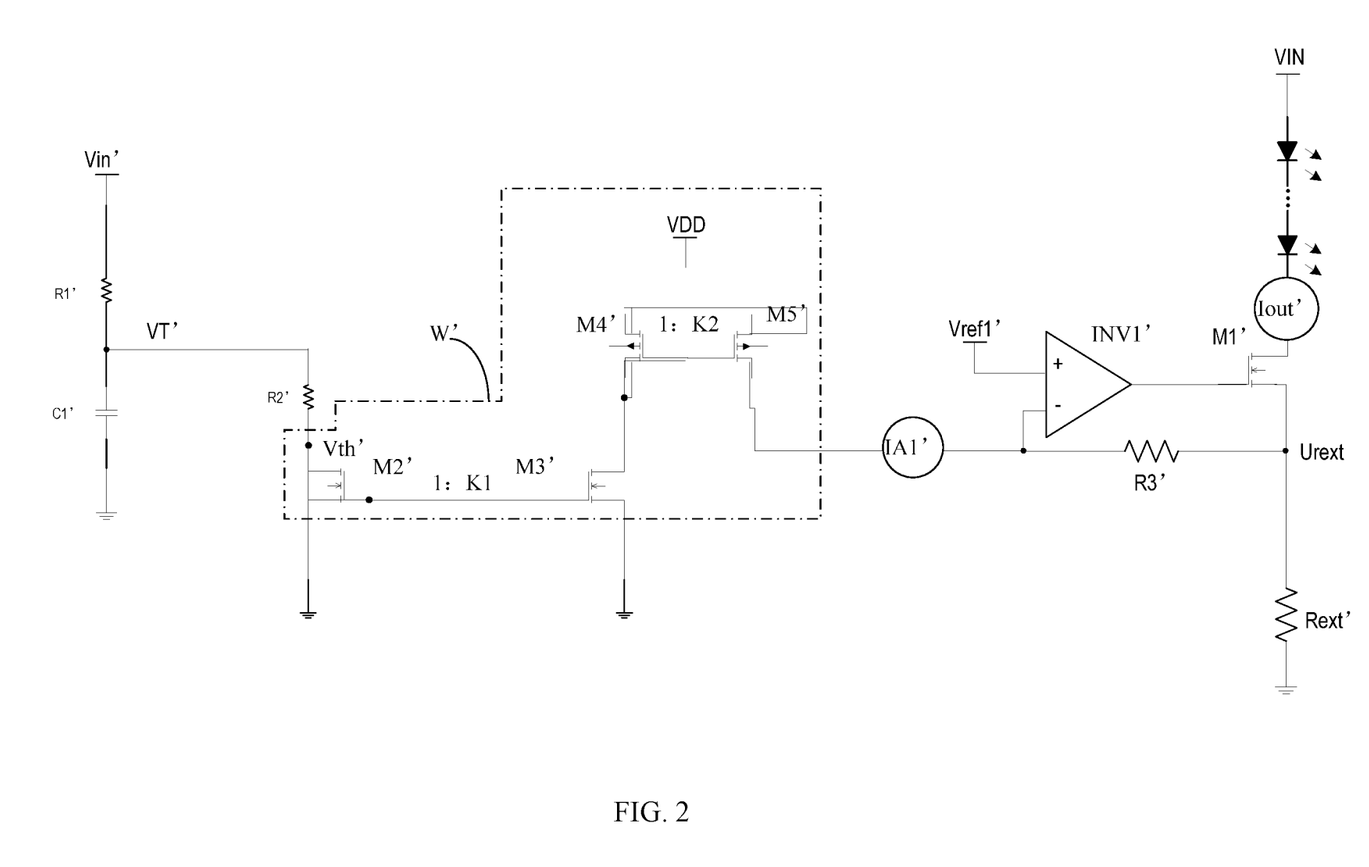
FIG. 2 shows a schematic diagram of elements included in various modules in FIG. 1.

FIG. 1 shows a schematic module diagram of a conventional control circuit 100' based on a constant power technology. The control circuit 100' includes a signal sampling module 10', a constant power regulation module 20', a constant current driving module 30' and a power supply module 40', and the control circuit 100' provides a working current to the light source load 50'. FIG. 2 is a specifically schematic diagram of the control circuit 100' in FIG. 1, a signal sampling input voltage Vin' input to the signal sampling module 10' in FIG. 2 can be obtained from the power supply module 40' or an input terminal of the constant current input module. In addition, the power supply module 40' can also supply power to the signal sampling module 10', the constant power regulation module 20', the constant current driving module 30', and the light source load 50' at the same time. In FIG. 2, the first resistor R1', the second resistor R2', and the first switching transistor M1' form a working loop, and the working current of the loop generates a first regulation output current IA1' after passing through the current mirror module W' in the constant power regulation module 20'. After the first switching transistor M1' is turned on, the drain electrode voltage Vth' on the drain electrode of the first switching transistor M1', the current mirror module W' includes a first current mirror and a second current mirror, a current ratio of the first current mirror is K1, and a current ratio of the second current mirror is K2, thereby obtaining the following formula.

$$IA1' = \frac{Vin' - Vth'}{R1' + R2'} * K1 * K2 \quad (1)$$

Further, in FIG. 2, a first reference voltage Vref1' input by the first positive input terminal of the first operational amplifier INV1' and the current regulation resistor Rext' can adjust the current passing through the light source load 50', the load working current Iout' of a LED light string can be obtained by the following formula.

$$Iout' = \frac{Vref1' - IA1' * R3'}{Rext'} \quad (2)$$

Figure 3A:
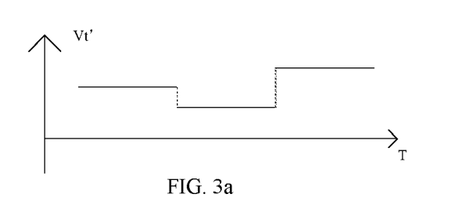
FIG. 3a shows a schematic waveform diagram of a working process Vt'.
Figure 3B:
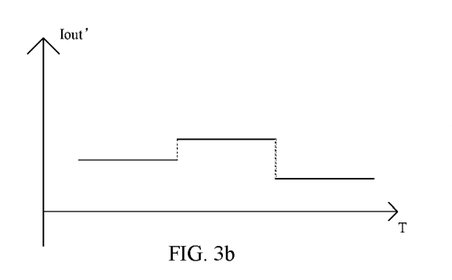
FIG. 3b shows a schematic waveform diagram of a working process Iout'.
Figure 3C:
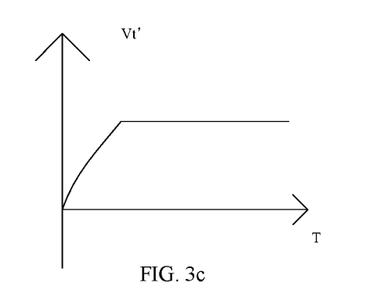
FIG. 3c shows a schematic waveform diagram at a moment of power-on Vt'.
Figure 3D:
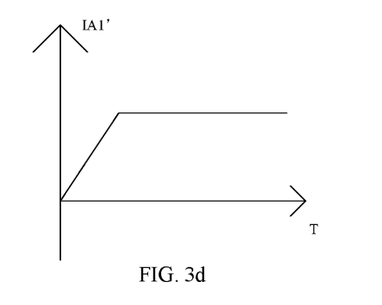
FIG. 3d shows a schematic waveform diagram at a moment of power-on IA1'.
Figure 3E:
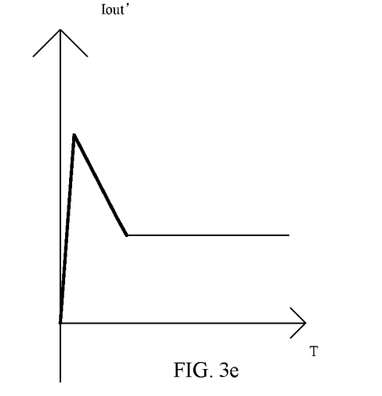
FIG. 3e shows a schematic waveform diagram at a moment of power-on Iout'.

In formula (1), only the signal sampling input voltage Vin' is a variable, as the input voltage of the power supply module 40' as shown in FIG. 1 is increased, the signal sampling input voltage Vin' becomes larger, the first regulation output current IA1' becomes larger, and the load working current Iout' on the light string in formula (2) becomes smaller. When the input voltage of the power supply module 40' is reduced, the signal sampling input voltage Vin' becomes smaller, the first regulation output current IA1' becomes smaller, and the load working current Iout' of the light string becomes larger. Specifically, as shown in the waveform diagram of FIG. 3a and FIG. 3b, in a case where the signal sampling input voltage Vin' is a constant value, the limiting voltage value Vt' is also a constant value, and the corresponding load working current Iout' is a constant value. Specifically, it can be seen from FIG. 3a and FIG. 3b that, in the working process, the change trends of the limiting voltage value Vt' and the load working current Iout' are opposite, or they are negatively correlated. As shown in FIG. 2, the first capacitor C1' converts the voltage signal of the voltage limiting terminal VT' into a direct current voltage. At the moment when the control circuit 100 is powered on, the signal sampling input voltage Vin' passes through the first resistor R1' and charges the first capacitor C1' at the same time, and in the charging process of the first capacitor C1', after period t, the voltage value of the voltage limiting terminal VT', that is, the limiting voltage value Vt', is increased from 0V to the constant value, as shown in FIG. 3C. In this period t, the current passing through the voltage limiting terminal VT' changes from 0 to the constant value, and is equal to the ratio of (Vin'-Vth') to (R1'+R2'). The current waveform of the first regulation output current IA1' generated after passing through the first current mirror and the second current mirror in the current mirror module W' is risen from 0 to a constant value at the moment when the control circuit is powered on, as shown in the waveform diagram of FIG. 3d. When IA1 is the minimum value of 0V, it can be seen through formula (2) that the load working current Iout' is the maximum value, as shown in FIG. 3e. After the control circuit 100 is powered on, the first capacitor C1' is fully charged, the constant voltage is maintained at the voltage limiting terminal VT', at this time, when the first regulation output current IA1' is the maximum value, the load working current Iout' is reduced to the minimum value, and the constant current value is output. The load working current Iout' of the light source load 50' at the moment of the control circuit 100 powered on is shown in FIG. 3e, and a current overshoot waveform is generated at the moment of power-on.

Example 1

In order to solve the problem of current overshoot on a light source load including an LED light string in a power-on process, examples of the present disclosure provide a control circuit 100, and the working current provided to the light source load 60, such as an LED light string, by the control circuit 100 does not have a current overshoot in a power-on process.

Figure 4A:
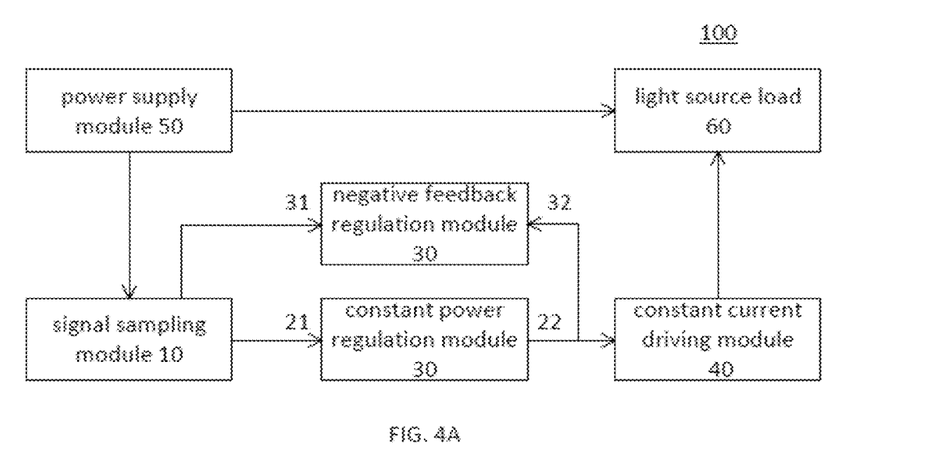
FIG. 4A is a schematic module diagram of the control circuit provided by example 1 of the present disclosure.
Figure 4B:
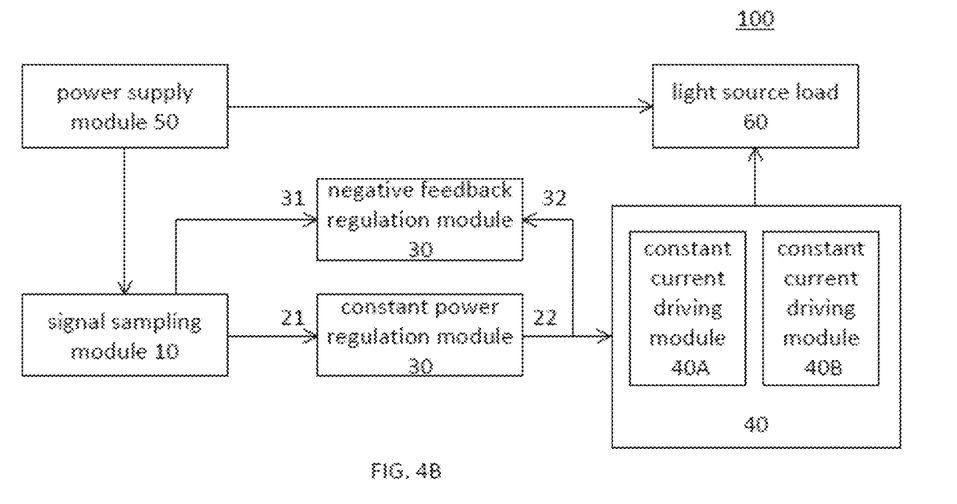
FIG. 4B is a schematic module diagram of the control circuit provided by example 2 of the present disclosure.

As shown in FIG. 4A, the control circuit 100 according to an example of the present disclosure includes a signal sampling module 10, a constant power regulation module 20, a negative feedback regulation module 30, and a constant current driving module 40.

Figure 5:
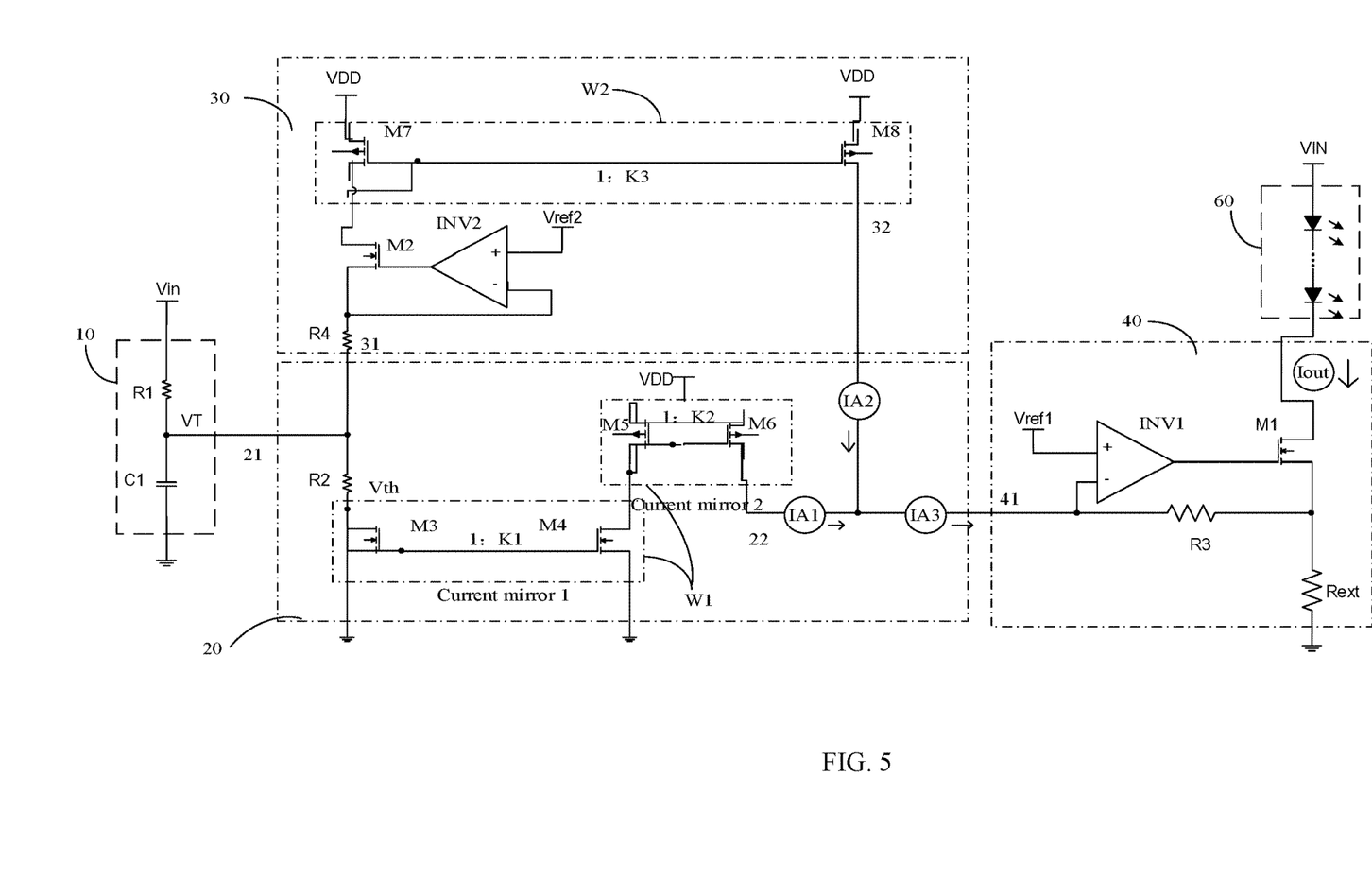
FIG. 5 shows a schematic diagram of elements included in various modules in FIG. 4.

Referring to FIG. 5, the signal sampling module 10 includes a voltage limiting terminal VT, and the voltage limiting terminal VT is configured to output a limiting voltage value Vt lower than a first threshold value. The constant power regulation module 20 includes a first regulation input terminal 21 and a first regulation output terminal 22, the voltage limiting terminal VT is connected to the first regulation input terminal 21, and the output current of the first regulation output terminal 22 is positively correlated with the input voltage of the first regulation input terminal 21. The negative feedback regulation module 30 includes a second regulation input terminal 31 and a second regulation output terminal 32, the voltage limiting terminal VT is connected to the second regulation input terminal 31, and the output current of the second regulation output terminal 32 is negatively correlated with the input voltage of the second regulation input terminal 31. The constant current driving module 40 includes a driving input terminal 41, the first regulation output terminal 22 and the second regulation output terminal 32 are connected to the driving input terminal 41. Because the output current of the first regulation output terminal 22 is positively correlated with the limiting voltage value Vt of the voltage limiting terminal VT, and the output current of the second regulation output terminal 32 is negatively correlated with the limiting voltage value Vt of the voltage limiting terminal VT, during the power-on process of the control circuit 100, that is, during the process of the voltage of the voltage limiting terminal VT increases from 0 to the first threshold value, the current input to the driving input terminal 41 may be relatively constant, so that the load working current Iout on the light source load 60 connected with the constant current driving module 40 is also relatively constant, and the phenomenon of current overshoot generated on the light source load 60 is avoided.

In the example of the present disclosure, the signal sampling module 10 may include a first capacitor C1 and a first resistor R1, the first resistor R1 and the first capacitor C1 are sequentially connected in series between the signal sampling input voltage Vin and the grounding terminal, in other words, two terminals of the first resistor R1 are respectively connected to the signal sampling input voltage Vin and the first capacitor C1, two terminals of the first capacitor C1 are respectively connected to the first resistor R1 and the grounding terminal, and the voltage limiting terminal VT is located on an end point between the first capacitor C1 and the first resistor R1. Because two terminals of the first capacitor C1 are respectively a voltage limiting terminal VT and a grounding terminal, at an initial moment when the power supply supplies power to the signal sampling module 10, a voltage value at two terminals of the first capacitor C1 is 0V, the limiting voltage value Vt on the voltage limiting terminal VT is also 0V, and until the first capacitor C1 is fully charged, the limiting voltage value Vt on the voltage limiting terminal VT is also a constant value, in other words, the maximum value of the output voltage on the voltage limiting terminal VT may be determined by the capacitance value of the first capacitor C1, that is, the first threshold value is determined by the capacitance value of the first capacitor C1. Of cause, as deformation, other elements may also be used to determine the first threshold value of the voltage limiting terminal, so that the voltage of the voltage limiting terminal VT in the power-on process rises from 0V to the first threshold value, and details are not described herein again.

In the example of the present disclosure, the constant power regulation module 20 may include a second resistor R2 and a constant power current mirror W1. The second resistor R2 is connected between the voltage limiting terminal VT and the constant power current mirror W1, and the constant power current mirror W1 is connected between the second resistor R2 and the constant current driving module 40. The constant power current mirror W1 includes at least one current mirror module, and specifically, the constant power current mirror W1 may include a first current mirror and a second current mirror connected in series, of course, more current mirrors may be connected in series. The current ratio of the first current mirror is K1, and the current ratio of the second current mirror is K2.

With reference to the above formula (1), the current output by the first regulation output terminal 22 of the constant power regulation module 20 is the first regulation output current IA1, and the output current may be determined by following formula:

$$IA1 = \frac{Vin - Vth}{R1 + R2} * K1 * K2 \qquad (3)$$

It can be seen from the formula (3) that the magnitude of the first regulation output current IA1 is positively correlated with the signal sampling input voltage Vin, that is, the first regulation output current IA1 is positively correlated with the limiting voltage value Vt of the voltage limiting terminal VT.

In the example of the present disclosure, as shown in FIG. 5, the constant current driving module 40 may include a first operational amplifier INV1, a third resistor R3, a first switching transistor M1, and a current regulation resistor Rext. The first operational amplifier INV1 includes a first positive input terminal, a first negative input terminal, and a first amplification output terminal. The first switching transistor M1 includes a first source electrode, a first drain electrode, and a first gate electrode, a first reference voltage Vref1 is input to the first positive input terminal, the first source electrode and the first gate electrode are short-circuited and are connected to the first amplification output terminal, the third resistor R3 is connected between the first amplification output terminal and the first negative input terminal, the current regulation resistor Rext is connected between the first source electrode and the grounding terminal, the driving input terminal 41 includes the first negative input terminal, and the first drain electrode is configured to connect the light source load 60. It can be seen that the first operational amplifier INV1, the third resistor R3, and the current regulation resistor Rext are used as a non-reverse closed-loop amplifier in the constant current driving module, and the first switching transistor M1 may be an MOS transistor. In practical application, if the load working current Iout flowing through the light source load 60 needs to be adjusted, the resistance value of the resistor Rext may be adjusted, or the first reference voltage Vref1 input to the first positive input terminal may be adjusted, or the fourth resistor R4 may be adjusted. In order to facilitate proportional regulation and fine regulation of the load working current Iout flowing through the light source load 60, the current regulation resistor Rext is usually set as an adjustable resistor, and regulating the load working current Iout is achieved by changing the resistance value of the current regulation resistor Rext. Of cause, the constant current driving module 40 may be formed by other electronic elements connected, and details are not described herein again.

It should be noted that the drain electrode voltage Vth in the formula (3) is the drain electrode voltage of the third switching transistor M3 in FIG. 5.

In the examples of the present disclosure, the negative feedback regulation circuit 30 includes a fourth resistor R4, a second operational amplifier INV2, a second switching transistor M2, and a feedback current mirror W2. The second operational amplifier INV2 includes a second positive input terminal, a second negative input terminal, and a second amplification output terminal, and the second switching transistor includes a second source electrode, a second drain electrode, and a second gate electrode. The feedback current mirror W2 includes a feedback input terminal and a feedback output terminal. A second reference voltage Vref2 is input to the second positive input terminal, the second source electrode and the second gate electrode are short-circuited and are connected to the second amplification output terminal and the second negative input terminal, and the fourth resistor R4 is connected between the second gate electrode and the voltage limiting terminal VT; and the second drain electrode is connected to the feedback input terminal, and the second regulation output terminal 32 includes the feedback output terminal. The second operational amplifier INV2 are used as a non-reverse closed-loop amplifier in the negative feedback regulation circuit 30, and the second switching transistor M2 may be an MOS transistor. By using the non-reverse closed-loop amplification effect of the second operational amplifier INV2, the current value entering the feedback input terminal of the feedback current mirror W2 in the negative feedback regulation module 30 is negatively correlated with the limiting voltage value Vt of the voltage limiting terminal VT, thereby achieving the negative feedback. The current ratio of the feedback current mirror W2 may be K3, and the feedback current mirror W2 may include at least one current mirror.

Referring to FIG. 5, the current output by the second regulation output terminal 32 of the negative feedback regulation module 30 is the second regulation output current IA2, and the second regulation output current IA2 is specifically obtained from the following formula:

$$IA2 = \frac{Vref2 - Vt}{R4} * K3 \quad (4)$$

Figure 6A:
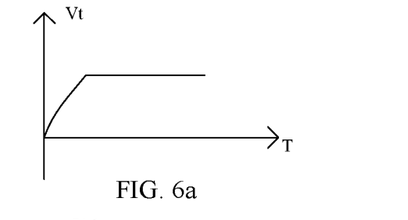
FIG. 6a shows a schematic waveform diagram at a moment of power-on Vt in FIG. 5.
Figure 6B:
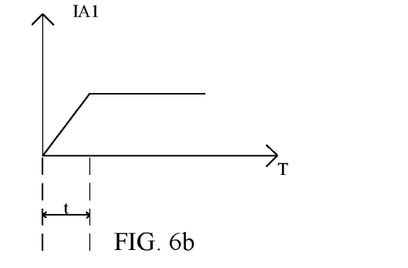
FIG. 6b shows a schematic waveform diagram at a moment of power-on IA1 in FIG. 5.
Figure 6C:
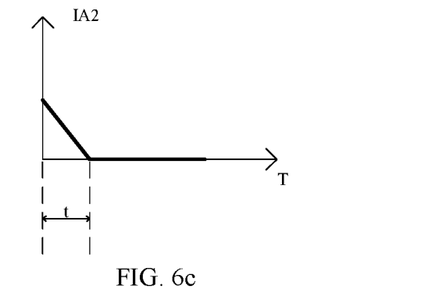
FIG. 6c shows a schematic waveform diagram at a moment of power-on IA2 in FIG. 5.

At the moment that the control circuit 100 is powered on, the signal sampling input voltage Vin charges the first capacitor C1 through the first resistor R1, and the limiting voltage value Vt on the voltage limiting terminal VT is risen from 0 to a constant value (as shown in FIG. 6a), that is, the voltage value Vt is risen to the first threshold value. At the moment that the control circuit 100 is powered on, as mentioned above, the waveform of the first regulation output current IA1 is in a upward trend, that is, the value of the first regulation output current IA1 is positively correlated with the limiting voltage value Vt (as shown in FIG. 6b), it can be seen from the formula (4) that the waveform of the second regulation output current IA2 is in a downward trend, that is, the value of the second regulation output current IA2 is negatively correlated with the limiting voltage value Vt (as shown in FIG. 6c).

In order to enable the charge capacity of the first capacitor C1 to be full of the first threshold, that is, after the control circuit 100 completes the power-on operation, the second regulation output current IA2 output by the second regulation output terminal 32 of the negative feedback regulation module 30 is 0, so that the first regulation output current IA1 output by the first regulation output terminal 22 of the constant power regulation module 20 is equal to the current value input to the constant current driving module 40, and the second reference voltage Vreft2 may be set to be equal to the first threshold value.

Figure 6D:
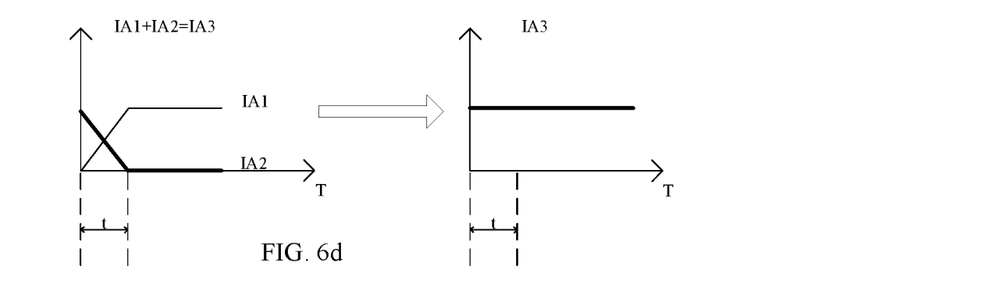
FIG. 6d shows a schematic waveform diagram at a moment of power-on IA3 in FIG. 5.

As shown in FIG. 5, the first regulation output current IA1 output by the first regulation output terminal 22 of the constant power regulation module 20 and the second regulation output current IA2 output by the second regulation output terminal 32 of the negative feedback regulation module 30 are converged to form a driving input current IA3 (as shown in FIG. 6d), and it is input to the constant current driving module 40 from the driving input terminal 41. At the moment t when the control circuit 100 is powered on, because the first regulation output current IA1 is in an upward trend and the second regulation output current IA2 is in a downward trend, the driving input current IA3 can be made to be a constant value by adjusting the relevant parameters of the formulas (1) and (3).

Specifically, at the moment when power-on is started, the first regulation output current IA1 is 0, at this time, the limiting voltage value is 0, and the second regulation output current IA2 is $$IA2 = \frac{Vref2}{R4} * K3.$$

After the power-on operation is completed, the value of the first regulation output current IA1 should be equal to the start power-on instantaneous current IA2, that is, $$IA1 = \frac{Vin - Vth}{R1 + R2} * K1 * K2 =$$
$$\frac{VT - Vth}{R2} * K1 * K2 = \frac{Vref2 - Vth}{R2} * K1 * K2 = \frac{Vref2}{R4} * K3$$

Moreover, the driving input current IA3 obtained by the sum of the first regulation output current IA1 and the second regulation output current IA2 should be a constant value.

It can be seen from FIG. 5 and FIG. 6a to FIG. 6e that, at this time, the load working current Iout is:

$$Iout = \frac{Vref1 - IA3 * R3}{Rext} \quad (5)$$

Figure 6E:
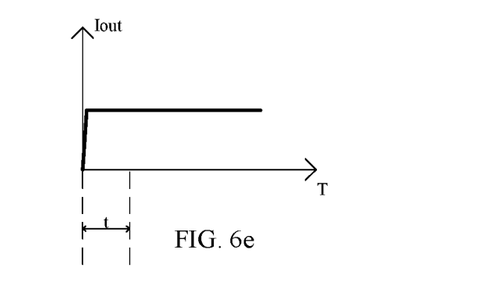
FIG. 6e shows a schematic waveform diagram at a moment of power-on Iout in FIG. 5.

When the driving input current IA3 is a constant value, the waveform diagram of the corresponding load working current Iout is shown in FIG. 6e, and it can be seen that the load working current Iout has no current overshoot phenomenon in the power-on process. In the example of the present disclosure, the control circuit 100 further includes a power supply module 50, and the power supply module 50 supplies power to the signal sampling module 10, the constant power regulation module 20, the negative feedback regulation module 30, and the constant current driving module 40. Of cause, the power supply of the signal sampling module 10, the constant power regulation module 20, the negative feedback regulation module 30, and the constant current driving module 40 may not be provided by the same power supply module 50.

Figure 7:
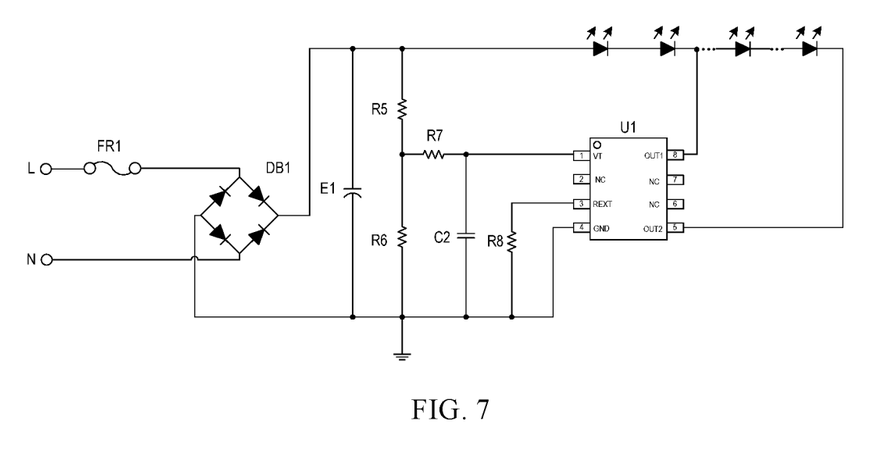
FIG. 7 shows a schematic diagram of an application circuit after remaining modules except for the light source load in FIG. 5 are integrated.

In the examples of the present disclosure, in order to improve the integration level, the signal sampling module 10, the constant power regulation module 20, the negative feedback regulation module 30, and the constant current driving module 40 may be collectedly arranged in an integrated circuit. Alternatively, at least two of the signal sampling module 10, the constant power regulation module 20, the negative feedback regulation module 30, and the constant current driving module 40 are collectedly arranged in an integrated circuit. As shown in FIG. 7, after the signal sampling module 10, the constant power adjusting module 20, the negative feedback adjusting module 30, and the constant current driving module 40 are integrated into the chip U1, a circuit is arranged on the periphery of the chip U1, and a working current is provided for the LED light string.

In this example of the present disclosure, one constant current driving module 40 may be provided.

In addition, each switching transistor in FIG. 5 may be a MOS transistor, and M5, M6, M7, and M8 may be P-type MOS transistors, that is, the MOS transistor connected to VDD is a P-type MOS transistor.

Example 2

Figure 8:
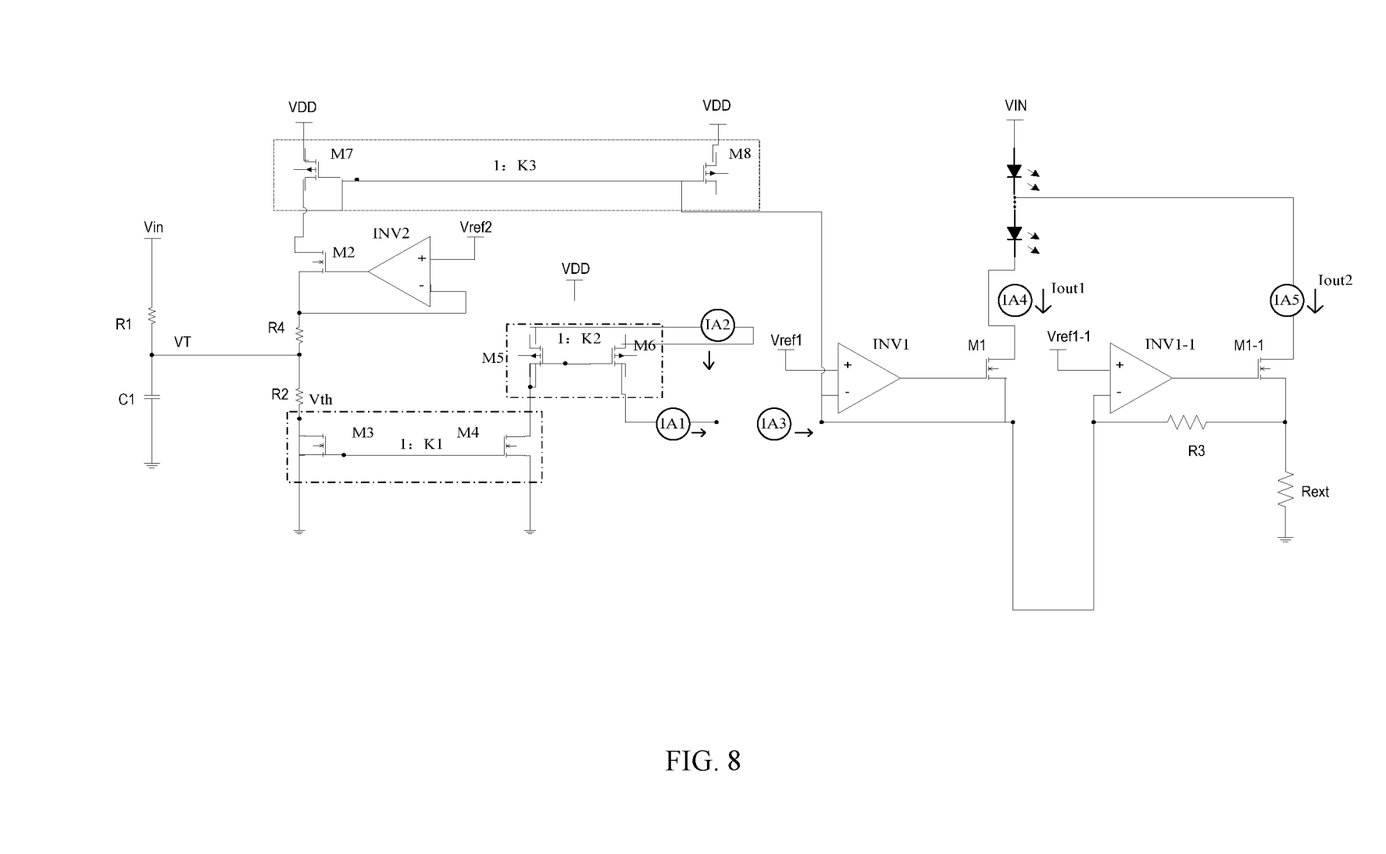
FIG. 8 shows a schematic element diagram of a control circuit including two parallel constant current driving modules in example 2 of the present disclosure.

The control circuit 100 according to example 2 of the present disclosure differs from example 1 in that: at least two constant current driving modules 40A and 40B (collectively "constant current driving modules 40") are provided, the at least two constant current driving modules 40A and 40B are arranged in parallel, the at least two second drain electrodes are configured to connect the light source load 60 in parallel. As shown in FIG. 8, a constant current driving module where the first operational amplifier INV1 and the first switching transistor M1 are located produces a first load current Iout1, and a constant current driving module where the third operational amplifier INV1-1 and the fourth switching transistor M1-1 are located produces a second load current Iout2, so that the load working current passing through the LED light string is the sum of the first load current Iout1 and the second load current Iout2.

The control circuit 100 according to the examples of the present disclosure is provided with a plurality of constant current driving modules 40 connected in parallel, so that the output power of the control circuit 100 can be increased, and the control circuit 100 has more expansion functions and has a wider application range.

Example 3

In addition, an example of the present disclosure also provides a lighting device.

An example of the present disclosure provides a lighting device, and the lighting device includes the light source load 60 as mentioned above and the control circuit 100 of example 1 or example 2. The light source load 60 is an LED light source, and because the control circuit 100 does not have a current overshoot phenomenon in the power-on process, the light source load 60 in the lighting device can have a longer service life, so that the lighting device has higher reliability.

In order to solve the problem of overshoot of current on a light source load at power-on moment of a control circuit, the present disclosure provides a control circuit and a lighting device.

The present disclosure provides a control circuit, comprising: a signal sampling module, a constant power regulation module, a negative feedback regulation module, and a constant current driving module; the signal sampling module comprises a voltage limiting terminal, the voltage limiting terminal is configured to output limiting voltage value, and the limiting voltage value is lower than a first threshold value; the constant power regulation module comprises a first regulation input terminal and a first regulation output terminal, the voltage limiting terminal is connected to the first regulation input terminal, and an output current of the first regulation output terminal is positively correlated with an input voltage of the first regulation input terminal; the negative feedback regulation module comprises a second regulation input terminal and a second regulation output terminal, the voltage limiting terminal is connected to the second regulation input terminal, and an output current of the second regulation output terminal is negatively correlated with an input voltage of the second regulation input terminal; and the constant current driving module comprises a driving input terminal, and the first regulation output terminal and the second regulation output terminal are connected to the driving input terminal.

In the control circuit, the signal sampling module comprises a first resistor and a first capacitor, two terminals of the first resistor are respectively connected to a signal sampling input voltage and the first capacitor, two terminals of the first capacitor are respectively connected to the first resistor and a grounding terminal, the voltage limiting terminal is an end point located between the first resistor and the first capacitor, and the first threshold value is determined by the capacitance value of the first capacitor.

In the control circuit, the constant power regulation module comprises a second resistor and a constant power current mirror, the second resistor is connected between the limiting terminal and the constant power current mirror, and the constant power current mirror is connected between the second resistor and the constant current driving module.

In the control circuit, the constant current driving module comprises a first operational amplifier, a third resistor, a first switching transistor, and a current regulation resistor; the first operational amplifier comprises a first positive input terminal, a first negative input terminal, and a first amplification output terminal; the first switching transistor comprises a first source electrode, a first drain electrode, and a first gate electrode; a first reference voltage is input to the first positive input terminal, the first source electrode and the first gate electrode are short-circuited and are connected to the first amplification output terminal, the third resistor is connected between the first amplification output terminal and the first negative input terminal, the current regulation resistor is connected between the first source electrode and the grounding terminal; and the driving input terminal comprises the first negative input terminal, and the first drain electrode is configured to connect a light source load.

In the control circuit, the negative feedback regulation circuit comprises a fourth resistor, a second operational amplifier, a second switching transistor, and a feedback current mirror; the second operational amplifier comprises a second positive input terminal, a second negative input terminal, and a second amplification output terminal, and the second switching transistor comprises a second source electrode, a second drain electrode, and a second gate electrode; the feedback current mirror comprises a feedback input terminal and a feedback output terminal; a second reference voltage is input to the second positive input terminal, the second source electrode and the second gate electrode are short-circuited and are connected to the second amplification output terminal and the second negative input terminal, and the fourth resistor is connected between the second gate electrode and the voltage limiting terminal; and the second drain electrode is connected to the feedback input terminal, and the second regulation output terminal comprises the feedback output terminal.

In the control circuit, the second reference voltage is equal to the first threshold value.

In the control circuit, one constant current driving module is provided; or at least two constant current driving modules are provided, the at least two constant current driving modules are arranged in parallel, and at least two second drain electrodes are configured to connect a light source load in parallel.

In the control circuit, the control circuit further comprises a power supply module, the power supply module is configured to supply power for the signal sampling module, the constant power regulation module, the negative feedback regulation module, and the constant current driving module.

In the control circuit, the signal sampling module, the constant power regulation module, the negative feedback regulation module, and the constant current driving module are collectedly arranged in an integrated circuit; or the constant power regulation module and the negative feedback regulation module are collectedly arranged in the integrated circuit.

In the control circuit, in a case where an output voltage of the voltage limiting terminal is between zero and the first threshold value, a sum of the output current of the first regulation output terminal and the output current of the second regulation output terminal is a constant value.

The present disclosure provides a lighting device, comprising a light source load and the control circuit according to any one of the control circuits, and the light source load is a LED light source.

The above-mentioned at least one technical solution adopted in the present disclosure can achieve the following beneficial effects:

In the power-on process of the control circuit, the voltage input to the driving input terminal of the constant current driving module rises slowly, resulting in the current overshoot phenomenon of the light source load. In the control circuit of examples of the present disclosure, because the output current of the first regulation output terminal is positively correlated with the output voltage of the voltage limiting terminal, and the output current of the second regulation output terminal is negatively correlated with the output voltage of the voltage limiting terminal, during the power-on process of the control circuit, that is, during the voltage at the voltage limiting terminal is changed from zero to the first threshold value, the current input to the driving input terminal can be relatively constant, so that the working current on the light source load connected to the constant current driving module is also relatively constant, and the phenomenon of current overshoot generated on the light source load is avoided.

The above examples of the present disclosure focus on the differences between the various examples, and different optimization features between the various examples may be combined to form a better example as long as different optimization features are not contradictory with each other, which is not repeated here in consideration of brevity.

The above descriptions are merely examples of the present disclosure, and are not intended to limit the present disclosure. Various modifications and variations of this application are possible for those skilled in the art. Any modification, equivalent replacement, improvement, etc. made within the spirit and principle of the present disclosure shall be included within the scope of the present disclosure.

What is claimed is:

1. A control circuit, comprising: a signal sampling module, a constant power regulation module, a negative feedback regulation module, and at least one constant current driving module; and wherein:
   the signal sampling module comprises a voltage limiting terminal, the voltage limiting terminal is configured to output limiting voltage value, and the limiting voltage value is lower than a first threshold value;
   the constant power regulation module comprises a first regulation input terminal and a first regulation output terminal, the voltage limiting terminal is connected to the first regulation input terminal, and an output current of the first regulation output terminal is positively correlated with an input voltage of the first regulation input terminal;
   the negative feedback regulation module comprises a second regulation input terminal and a second regulation output terminal, the voltage limiting terminal is connected to the second regulation input terminal, and an output current of the second regulation output terminal is negatively correlated with an input voltage of the second regulation input terminal; and
   the constant current driving module comprises a driving input terminal, and the first regulation output terminal and the second regulation output terminal are connected to the driving input terminal.

2. The control circuit according to claim 1, wherein the signal sampling module comprises a first resistor and a first capacitor, two terminals of the first resistor are respectively connected to a signal sampling input voltage and the first capacitor, two terminals of the first capacitor are respectively connected to the first resistor and a grounding terminal, the voltage limiting terminal is an end point located between the first resistor and the first capacitor, and the first threshold value is determined by the capacitance value of the first capacitor.

3. The control circuit according to claim 1, wherein the constant power regulation module comprises a second resistor and a constant power current mirror, the second resistor is connected between the voltage limiting terminal and the constant power current mirror, and the constant power current mirror is connected between the second resistor and the constant current driving module.

4. The control circuit according to claim 1, wherein:
   the constant current driving module comprises a first operational amplifier, a third resistor, a first switching transistor, and a current regulation resistor;
   the first operational amplifier comprises a first positive input terminal, a first negative input terminal, and a first amplification output terminal;
   the first switching transistor comprises a first source electrode, a first drain electrode, and a first gate electrode;
   a first reference voltage is input to the first positive input terminal, the first source electrode and the first gate electrode are short-circuited and are connected to the first amplification output terminal, the third resistor is connected between the first amplification output terminal and the first negative input terminal, the current regulation resistor is connected between the first source electrode and the grounding terminal; and
   the driving input terminal comprises the first negative input terminal, and the first drain electrode is configured to connect a light source load.

5. The control circuit according to claim 1, wherein the negative feedback regulation module comprises a fourth resistor, a second operational amplifier, a second switching transistor, and a feedback current mirror;
the second operational amplifier comprises a second positive input terminal, a second negative input terminal, and a second amplification output terminal, and the second switching transistor comprises a second source electrode, a second drain electrode, and a second gate electrode;
the feedback current mirror comprises a feedback input terminal and a feedback output terminal;
a second reference voltage is input to the second positive input terminal, the second source electrode and the second gate electrode are short-circuited and are connected to the second amplification output terminal and the second negative input terminal, and the fourth resistor is connected between the second gate electrode and the voltage limiting terminal; and the second drain electrode is connected to the feedback input terminal, and the second regulation output terminal comprises the feedback output terminal.

6. The control circuit according to claim 5, wherein the second reference voltage is equal to the first threshold value.

7. The control circuit according to claim 1, wherein the control circuit further comprises a power supply module, the power supply module is configured to supply power for the signal sampling module, the constant power regulation module, the negative feedback regulation module, and the constant current driving module.

8. The control circuit according to claim 1, wherein the signal sampling module, the constant power regulation module, the negative feedback regulation module, and the constant current driving module are collectedly arranged in an integrated circuit; or the constant power regulation module and the negative feedback regulation module are collectedly arranged in the integrated circuit.

9. The control circuit according to claim 1, wherein in a case where an output voltage of the voltage limiting terminal is between zero and the first threshold value, a sum of the output current of the first regulation output terminal and the output current of the second regulation output terminal is a constant value.

10. A lighting device, comprising a light source load and the control circuit according to any one of claim 1, and the light source load is a LED light source.

11. The control circuit according to claim 1, wherein one constant current driving module is provided.

12. The control circuit according to claim 1, wherein at least two constant current driving modules are provided, the at least two constant current driving modules are arranged in parallel.

13. A control circuit, comprising: a signal sampling circuit, a constant power regulator, a negative feedback regulator, and at least one constant current driver; and wherein:
the signal sampling circuit comprises a voltage limiting terminal, the voltage limiting terminal is configured to output limiting voltage value, and the limiting voltage value is lower than a first threshold value;
the constant power regulator comprises a first regulation input terminal and a first regulation output terminal, the voltage limiting terminal is connected to the first regulation input terminal, and an output current of the first regulation output terminal is positively correlated with an input voltage of the first regulation input terminal;
the negative feedback regulator comprises a second regulation input terminal and a second regulation output terminal, the voltage limiting terminal is connected to the second regulation input terminal, and an output current of the second regulation output terminal is negatively correlated with an input voltage of the second regulation input terminal; and
the constant current driver comprises a driving input terminal, and the first regulation output terminal and the second regulation output terminal are connected to the driving input terminal.

14. The control circuit according to claim 13, wherein the signal sampling circuit comprises a first resistor and a first capacitor, two terminals of the first resistor are respectively connected to a signal sampling input voltage and the first capacitor, two terminals of the first capacitor are respectively connected to the first resistor and a grounding terminal, the voltage limiting terminal is an end point located between the first resistor and the first capacitor, and the first threshold value is determined by the capacitance value of the first capacitor.

15. The control circuit according to claim 13, wherein the constant power regulator comprises a second resistor and a constant power current mirror, the second resistor is connected between the voltage limiting terminal and the constant power current mirror, and the constant power current mirror is connected between the second resistor and the constant current driver.

16. The control circuit according to claim 13, wherein:
the constant current driver comprises a first operational amplifier, a third resistor, a first switching transistor, and a current regulation resistor;
the first operational amplifier comprises a first positive input terminal, a first negative input terminal, and a first amplification output terminal;
the first switching transistor comprises a first source electrode, a first drain electrode, and a first gate electrode;
a first reference voltage is input to the first positive input terminal, the first source electrode and the first gate electrode are short-circuited and are connected to the first amplification output terminal, the third resistor is connected between the first amplification output terminal and the first negative input terminal, the current regulation resistor is connected between the first source electrode and the grounding terminal; and
the driving input terminal comprises the first negative input terminal, and the first drain electrode is configured to connect a light source load.

17. The control circuit according to claim 13, wherein the negative feedback regulator comprises a fourth resistor, a second operational amplifier, a second switching transistor, and a feedback current mirror;
the second operational amplifier comprises a second positive input terminal, a second negative input terminal, and a second amplification output terminal, and the second switching transistor comprises a second source electrode, a second drain electrode, and a second gate electrode;
the feedback current mirror comprises a feedback input terminal and a feedback output terminal;
a second reference voltage is input to the second positive input terminal, the second source electrode and the second gate electrode are short-circuited and are connected to the second amplification output terminal and the second negative input terminal, and the fourth resistor is connected between the second gate electrode and the voltage limiting terminal; and the second drain electrode is connected to the feedback input terminal, and the second regulation output terminal comprises the feedback output terminal.

18. The control circuit according to claim 13, wherein the control circuit further comprises a power supply circuit, the power supply circuit is configured to supply power for the signal sampling circuit, the constant power regulator, the negative feedback regulator, and the constant current driver.

19. The control circuit according to claim 13, wherein in a case where an output voltage of the voltage limiting terminal is between zero and the first threshold value, a sum of the output current of the first regulation output terminal and the output current of the second regulation output terminal is a constant value.

* * * * *